United States Patent
Han et al.

(10) Patent No.: US 11,183,664 B2
(45) Date of Patent: Nov. 23, 2021

(54) SEALING STRUCTURE AND SEALING METHOD, ELECTRONIC DEVICE AND SEALING LAYER RECYCLING METHOD

(71) Applicants: Hefei Xinsheng Optoelectronics Technology Co., Ltd., Hefei (CN); BOE Technology Group Co., Ltd., Beijing (CN)

(72) Inventors: Junqi Han, Beijing (CN); Youyuan Hu, Beijing (CN); Xinzhu Wang, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/465,670

(22) PCT Filed: Oct. 17, 2018

(86) PCT No.: PCT/CN2018/110674
§ 371 (c)(1),
(2) Date: May 31, 2019

(87) PCT Pub. No.: WO2019/076321
PCT Pub. Date: Apr. 25, 2019

(65) Prior Publication Data
US 2019/0305251 A1    Oct. 3, 2019

(30) Foreign Application Priority Data

Oct. 19, 2017 (CN) .......................... 201710976138.9

(51) Int. Cl.
*H01L 51/52* (2006.01)
*H01L 51/56* (2006.01)
*H01L 27/32* (2006.01)

(52) U.S. Cl.
CPC .......... *H01L 51/5253* (2013.01); *H01L 27/32* (2013.01); *H01L 51/52* (2013.01); *H01L 51/529* (2013.01); *H01L 51/56* (2013.01)

(58) Field of Classification Search
CPC ..... H01L 51/5253; H01L 51/52; H01L 27/32; H01L 51/529; H01L 51/56;
(Continued)

(56) References Cited

U.S. PATENT DOCUMENTS

2006/0272762 A1* 12/2006 Chiba ................... B29C 43/006
156/153
2012/0139821 A1* 6/2012 Kim ....................... H05B 33/00
345/76

(Continued)

FOREIGN PATENT DOCUMENTS

CN     101488463 A     7/2009
CN     104992955 A     10/2015
(Continued)

OTHER PUBLICATIONS

Jan. 16, 2019—(WO) International Search Report and Written Opinion Appn PCT/CN2018/110674 with English Translation.
(Continued)

*Primary Examiner* — Cuong B Nguyen
(74) *Attorney, Agent, or Firm* — Banner & Witcoff, Ltd.

(57) ABSTRACT

A sealing structure, a sealing method, an electronic device and a sealing layer recycling method are provided. The sealing structure is configured for sealing a functional device and includes a sealing layer and a stripping adhesive layer. The sealing layer covers the functional device; the stripping adhesive layer is bonded between the sealing layer and the functional device, and the stripping adhesive layer has a changeable stickiness to assist stripping off of the sealing layer.

17 Claims, 8 Drawing Sheets

(58) Field of Classification Search
CPC ............ H01L 27/3241; H01L 51/5246; H01L 51/5243; H01L 51/5237; H01L 21/76841; H01L 21/76843
See application file for complete search history.

(56) References Cited

U.S. PATENT DOCUMENTS

2016/0107421 A1\*   4/2016  Chung .................... B32B 17/00
                                                            428/41.8
2016/0133864 A1\*   5/2016  Kim ..................... C09D 165/02
                                                            257/88
2017/0140974 A1    5/2017  Kimura et al.
2017/0278716 A1\*   9/2017  Iino ....................... H01L 23/296
2019/0333942 A1\* 10/2019  Yamazaki ............ H01L 27/1262
2020/0312810 A1\* 10/2020  Hayashishita .......... H01L 25/18

FOREIGN PATENT DOCUMENTS

| CN | 107011816 A | 8/2017 |
| CN | 207517735 U | 6/2018 |
| EP | 2423285 A1 | 2/2012 |
| GB | 2491670 A | 12/2012 |

OTHER PUBLICATIONS

Jun. 2, 20211—(EP) Extended European Search Report Appn 18868872.5.

\* cited by examiner

SEALING STRUCTURE AND SEALING METHOD, ELECTRONIC DEVICE AND SEALING LAYER RECYCLING METHOD

The application is a U.S. National Phase Entry of International Application No. PCT/CN2018/110674 filed on Oct. 17, 2018, designating the United States of America and claiming priority to Chinese Patent Application No. 201710976138.9 filed on Oct. 19, 2017. The present application claims priority to and the benefit of the above-identified applications and the above-identified applications are incorporated by reference herein in their entirety.

TECHNICAL FIELD

At least one embodiment of the present disclosure relates to a sealing structure, a sealing method, an electronic device and a sealing layer recycling method.

BACKGROUND

For a display device without a backlight source, such as an organic light-emitting diode (OLED) display device, it is possible that a glass cover plate and a sealant frame are not used for sealing. For example, a transparent sealing film or an opaque sealing film such as a metal film is used to replace the glass cover plate to seal a light-emitter device, and a sealing adhesive is used to replace the sealant frame. The metal film has a good function of resisting water and oxygen, but the cost is high.

SUMMARY

At least one embodiment of the present disclosure provides a sealing structure for sealing a functional device, and the sealing structure includes a sealing layer and a stripping adhesive layer. The sealing layer covers the functional device; the stripping adhesive layer is bonded between the sealing layer and the functional device, and the stripping adhesive layer has a changeable stickiness to assist stripping off of the sealing layer.

For example, in the sealing structure provided by at least one embodiment of the present disclosure, the stripping adhesive layer has a work temperature, and the stickiness of the stripping adhesive layer is weakened in a situation where the stripping adhesive layer is heated to the work temperature or above the work temperature.

For example, the sealing structure provided by at least one embodiment of the present disclosure further includes a sealing adhesive layer which is between the functional device and the stripping adhesive layer and bonds the stripping adhesive layer and the functional device.

For example, in the sealing structure provided by at least one embodiment of the present disclosure, the work temperature is higher than a temperature of softening the sealing adhesive layer.

For example, in the sealing structure provided by at least one embodiment of the present disclosure, the stripping adhesive layer covers an entirety of the sealing adhesive layer, and a portion of the stripping adhesive layer overlaps the sealing adhesive layer.

For example, in the sealing structure provided by at least one embodiment of the present disclosure, the stripping adhesive layer covers an entirety of a first surface which is included by the sealing layer and which faces the functional device.

For example, in the sealing structure provided by at least one embodiment of the present disclosure, the sealing layer is a metal film.

For example, in the sealing structure provided by at least one embodiment of the present disclosure, a material of the stripping adhesive layer is a resin adhesive added with thermal expansion microspheres, or a rubber adhesive added with the thermal expansion microspheres.

For example, the sealing structure provided by at least one embodiment of the present disclosure further includes a heat dissipation structure on a side of the functional device facing the sealing layer or on a side of the functional device facing away from the sealing layer, and the heat dissipation structure is configured to assist heat dissipation of the sealing structure.

At least one embodiment of the present disclosure also provides an electronic device including the functional device and any one of the sealing structures provided by the embodiments of the present disclosure.

For example, the electronic device further includes a driver circuit, and the driver circuit is configured to control a work state of the functional device.

At least one embodiment of the present disclosure also provides a sealing method, which includes: providing a base substrate on which a functional device is provided; forming a sealing layer covering the functional device; and forming a stripping adhesive layer, which is bonded between the sealing layer and the functional device and which has a changeable stickiness to assist stripping off of the sealing layer.

For example, the sealing method provided by at least one embodiment of the present disclosure further includes forming a sealing adhesive layer by using a sealing adhesive, and the sealing adhesive layer is between the functional device and the stripping adhesive layer and bonds the stripping adhesive layer and the functional device.

For example, in the sealing method provided by at least one embodiment of the present disclosure, a structure of the sealing layer and the stripping adhesive layer is formed by attaching a first surface of the stripping adhesive layer to a first surface of the sealing layer; a first surface of the sealing adhesive is attached to a second surface of the stripping adhesive layer, in which the second surface of the stripping adhesive layer is opposite to the first surface of the stripping adhesive layer; and a second surface of the sealing adhesive is bonded to the functional device, in which the second surface of the sealing adhesive is opposite to the first surface of the sealing adhesive; or, a structure of the stripping adhesive layer and the sealing adhesive is formed by attaching a first surface of the stripping adhesive layer to a first surface of the sealing adhesive; the sealing layer is bonded to a second surface of the stripping adhesive layer, in which the second surface of the stripping adhesive layer is opposite to the first surface of the stripping adhesive layer; and a second surface of the sealing adhesive is bonded to the functional device, in which the second surface of the sealing adhesive is opposite to the first surface of the sealing adhesive.

For example, the sealing method provided by at least one embodiment of the present disclosure further includes: heating the sealing adhesive; forming a sealing adhesive layer by pressing the sealing adhesive and the functional device so that the sealing adhesive layer seals the functional device; and curing the sealing adhesive layer. A temperature for heating the sealing adhesive is lower than the work temperature of the stripping adhesive layer.

At least one embodiment of the present disclosure also provides a sealing layer recycling method, which is applicable to any one of the above-mentioned sealing structures. The method includes: treating the sealing structure until the stickiness of the stripping adhesive layer is weakened, and separating the sealing layer from the stripping adhesive layer.

For example, in the sealing layer recycling method provided by at least one embodiment of the present disclosure, the treating includes heating the sealing structure.

For example, in the sealing layer recycling method provided by at least one embodiment of the present disclosure, the heating includes radiation heating, convection heating or heat conduction heating.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE SIGNS

Figure 1:
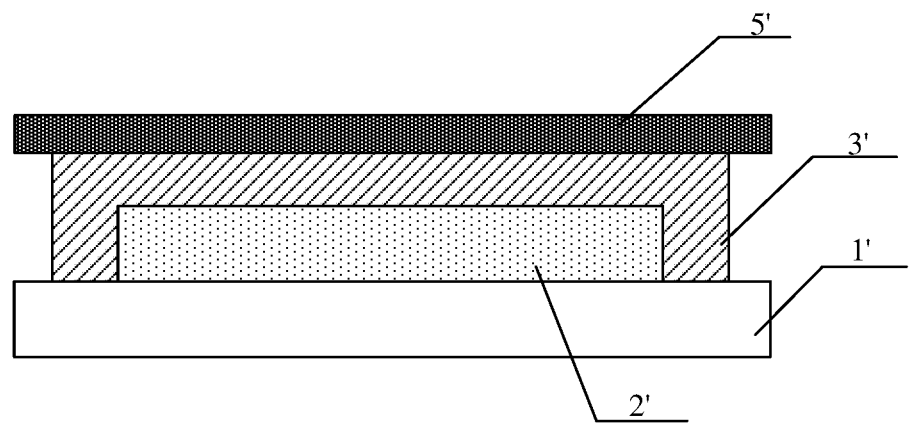
FIG. 1 is a schematic sectional view of a sealing structure.

1'—base substrate; 2'—organic light-emitting diode; 3'—sealing adhesive layer; 5'—metal film; 1—base substrate; 2—functional device; 3—sealing adhesive layer; 301—first surface of sealing adhesive; 302—second surface of sealing adhesive; 303—sealing adhesive; 4—stripping adhesive layer; 401—first surface of stripping adhesive layer; 402—second surface of stripping adhesive layer; 5—sealing layer; 501—first surface of sealing layer; 6—heat dissipation structure; 7—structure of the sealing layer and the stripping adhesive layer; 8—structure of the stripping adhesive layer and the sealing adhesive; 9—gate line; 10—sealing structure; 11—electronic device; 12—data line; 13—non-display region; 14—pixel unit; 101—light-emitting unit.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. The described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The dimensions of the drawings used in the present disclosure are not strictly drawn to actual scale, and the number of pixel units in an organic light-emitting diode sealing structure is not limited to the number shown in the drawings, and the specific dimensions and number of each structure may be determined according to actual needs. The drawings in the disclosure are only schematic structural diagrams.

In the present disclosure, for example, A "covering" B means that at least a portion of an orthographic projection of A on, for example, a base substrate which serves as a base reference, overlaps an orthographic projection of B on the base substrate. For example, overlapping of A and B means that A overlaps B in a direction perpendicular to the base substrate, that is, the orthographic projection of A on the base substrate overlaps the orthographic projection of B on the base substrate.

FIG. 1 is a sealing structure. As shown in FIG. 1, the sealing structure includes a base substrate 1', an organic light-emitting diode 2', a sealing adhesive layer 3' and a metal film 5'. The organic light-emitting diode 2' is provided on the base substrate 1', the metal film 5' covers the organic light-emitting diode 2', and the sealing adhesive layer 3' is bonded between the organic light-emitting diode 2' and the metal film 5' to bond the organic light-emitting diode 2' and the metal film 5' and seal the organic light-emitting diode 2'. The metal film has a good function of resisting water and oxygen, but the cost of the metal film is relatively high in a sealing process. If it is realized that the metal film in a waste display screen sealed by the metal film is recycled under the condition of the recycling cost being obviously lower than the purchase or production cost of the metal film, the recycling of resources and the decrease of the production cost of the display device are facilitated. The above sealing structure is able to achieve a good sealing effect; however, after the display device to which the above sealing structure is applied, such as a display screen, is scrapped, the sealing adhesive layer on the metal film needs to be removed if the metal film in the display device is to be recycled. A cathode metal layer and a protective layer of the organic light-emitting diode are often adhered to the metal film. In the process of removing substances such as the sealing adhesive layer on the metal film, residue or metal film damage are easily caused, time and money are consumed, and it is difficult to clean the adhesive on the metal film.

At least one embodiment of the present disclosure provides a sealing structure which is configured for sealing a functional device and includes a sealing layer and a stripping adhesive layer. The sealing layer is provided to cover and seal the functional device; the stripping adhesive layer is bonded between the sealing layer and the functional device, and the stripping adhesive layer has a changeable stickiness to assist the stripping off of the sealing layer. Cases requiring the sealing structure for example include recycling and repairing the sealing layer and the like.

Figure 2:
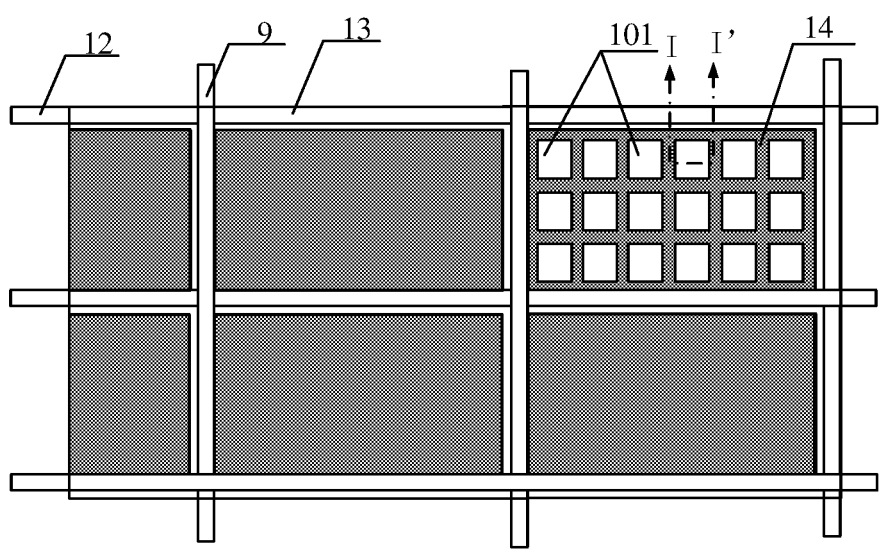
FIG. 2 is a schematic plan view of a sealing structure provided by at least one embodiment of the disclosure.
Figure 3:
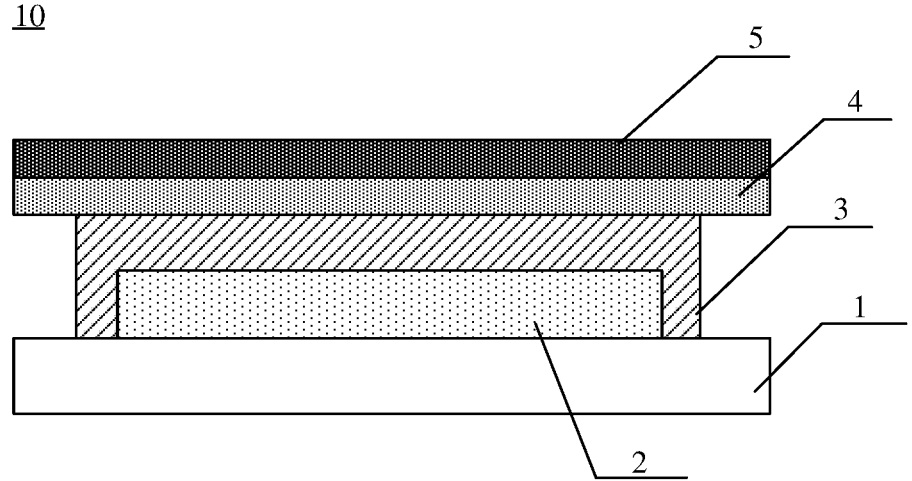
FIG. 3 is a schematic sectional view taken along a line I-I' in FIG. 2.
Figure 4:
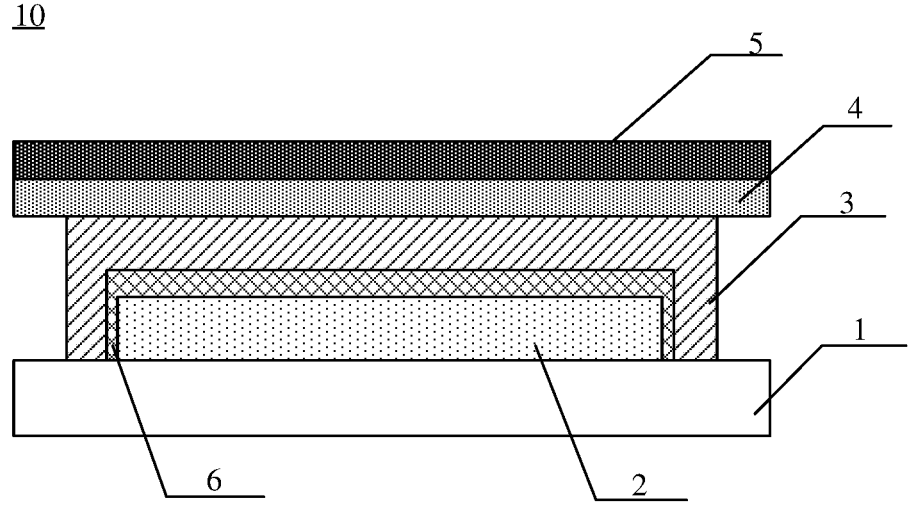
FIG. 4 is another schematic sectional view taken along the line I-I' in FIG. 2.

For example, FIG. 2 is a schematic plan view of the sealing structure according to at least one embodiment of the present disclosure, FIG. 3 is a schematic sectional view along a line I-I' in FIG. 2, and FIG. 4 is another schematic sectional view along the line I-I' in FIG. 2.

At least one embodiment of the present disclosure provides the sealing structure which is configured for sealing the functional device and includes the sealing layer and the stripping adhesive layer. The sealing layer is provided to cover and seal the functional device; the stripping adhesive layer is bonded between the sealing layer and the functional device, and the stripping adhesive layer has the changeable stickiness to assist the stripping off of the sealing layer.

Illustratively, as shown in FIG. 3, for example, the sealing structure 10 includes the base substrate 1, the functional device 2, the sealing layer 5 and the stripping adhesive layer 4. The functional device 2 is disposed on the base substrate 1. The base substrate 1 includes, for example, a glass substrate, a quartz substrate, a plastic substrate or the like. The sealing layer 5 is provided to cover the functional device 2. For example, the functional device 2 is a light-emitter device, such as an organic light-emitting diode (OLED) device, or an electroluminescent (EL) device, or the like. For example, the functional device 2 is a solar cell or the like. The embodiments of the present disclosure do not limit the type of the functional device 2. The stripping adhesive layer 4 is bonded between the sealing layer and the functional device; for example, a first surface which is included by the stripping adhesive layer 4 and is close to the sealing layer 5 and a second surface which is included by the stripping adhesive layer 4 and faces away from the sealing layer 5 are both adhesive (sticky). The stripping adhesive layer 4 has the changeable stickiness to assist the stripping off of the sealing layer if necessary.

For example, the stripping adhesive layer 4 has a work temperature. In a situation where the stripping adhesive layer 4 is heated to the work temperature or above the work temperature, the stickiness of the stripping adhesive layer 4 is weakened, especially the stickiness that the stripping adhesive layer 4 has with respect to the sealing layer 5 is weakened, and the stripping adhesive layer 4 becomes easy to be stripped off from the sealing layer 5. For example, a degree to which the stickiness of the stripping adhesive layer 4 is weakened is as follows: in the situation where the stripping adhesive layer 4 is heated to the work temperature or above the work temperature, the stickiness of the stripping adhesive layer 4 is weakened to such an extent that the stripping adhesive layer 4 and the sealing layer 5 are separated without leaving a portion of the stripping adhesive layer 4 on a first surface which is included by the sealing layer 5 and is in contact with the stripping adhesive layer 4.

Because a material of a sealing adhesive layer 3 and a material of the stripping adhesive layer 4 are all adhesives and have an adhesive effect, an adhesive strength between the stripping adhesive layer 4 and the sealing adhesive layer 3 is higher than an adhesive strength between the stripping adhesive layer 4 and the sealing layer 5. In this way, in recycling the sealing layer 5 of the sealing structure 10, the sealing layer 5 is stripped off without the residual of the sealing adhesive layer and the damage to the sealing layer, and at the same time, the stripping adhesive layer 4 is not separated from the sealing adhesive layer 3 in the process of stripping off the sealing layer 5. Therefore, it is possible to realize that the sealing layer 5 is recycled and reused to seal another functional device, and then the obtained sealing structure is applied to the electronic device. Moreover, the method realizes this recycling process at a cost lower than the manufacturing or purchase price of the sealing layer. This is beneficial to the recycling of resources and the decrease of the production cost of the sealing structure and the electronic device.

For example, the sealing structure 10 further includes the sealing adhesive layer 3 which is disposed between the functional device 2 and the stripping adhesive layer 4, and which bonds the stripping adhesive layer 4 with the functional device 2. The sealing adhesive layer 3 has a strong stickiness and firmly bonds the stripping adhesive layer 4 with the functional device 2. In addition, the sealing adhesive layer 3 seals the functional device 2 so that the functional device 2 is insulated from substances harmful to the functional device 2 such as moisture, oxygen, etc. For example, a material of the sealing adhesive layer 3 is any suitable sealant, which, for example, includes thermosetting sealant, such as addition type organic silicon adhesive; or the sealant includes photocurable sealant (e.g., ultraviolet curable sealant), such as epoxy acrylic resin, etc. Of course, the material of the sealing adhesive layer 3 is not limited to the types listed above, and those skilled in the art may select according to actual requirements.

For example, the sealing adhesive layer 3 includes a filling material doped into a base material, the filling material includes, for example, a hygroscopic material, a heat dissipation material, or an oxygen absorption material, etc., and a material of the base material is, for example, the above sealant. Because the functional device 2, such as the organic light-emitting diode, includes many organic light-emitting materials that easily react with water and oxygen to affect their own performances, resulting in degradation of the function of the organic light-emitting diode, and because the organic materials are not resistant to a high temperature, the addition of the hygroscopic material, the oxygen absorption material and/or the heat dissipation material to the sealing adhesive layer 3 is able to protect the organic light-emitting diode and to prolong the service life of the organic light-emitting diode. For example, the hygroscopic material is a desiccant such as quicklime (CaO) or a water absorbent resin; the oxygen absorption material is an inorganic oxygen absorption agent, such as metal powder (including iron powder, copper powder, or the like), a mixture of sodium hyposulfite and iron powder, or sodium disulfite, or the like, or the oxygen absorption material is an organic oxygen absorption agent, such as butyl hydroxy anisd (BHA) or butylated hydroxytoluene (BHT) or the like; the heat dissipation material is a heat conductive lipid or is, for example, heat dissipating particles formed of zinc oxide, aluminum oxide or boron nitride or the like. Of course, in the embodiments of the present disclosure, the filling material included by the sealing adhesive layer 3 is not limited to the above-mentioned three kinds of the hygroscopic material, the oxygen absorption material and the heat dissipation material, but may also include other materials beneficial to protecting the organic functional device 2, and the above-mentioned three kinds of materials are not limited to the listed types, and the embodiments of the present disclosure are not limited thereto.

For example, before sealing, the sealing adhesive layer 3 is a sheet-like adhesive layer in an uncured state, for example, the sealing adhesive layer 3 is attached to cover the organic functional device 2. The sealing adhesive layer 3 becomes soft after being heated to a certain temperature, and the functional device 2 is sealed by pressing the sealing adhesive layer 3 which is bonded with the stripping adhesive layer 4 and the functional device 2. For example, the above-mentioned work temperature of the stripping adhesive layer 4 is higher than the temperature of softening the sealing adhesive layer 3, so that the temperature at which the sealing adhesive layer 3 is heated to soften the sealing adhesive layer 3 during the sealing process does not reach the work temperature of the stripping adhesive layer 4 and thus does not weaken the stickiness of the stripping adhesive layer 4, and thereby the stability of the bonding between the sealing layer 5 and the stripping adhesive layer 4 and the stability of the bonding between the stripping adhesive layer 4 and the sealing adhesive layer 3 during the sealing process are maintained. For example, the sealing adhesive layer 3 becomes soft in a situation where the temperature reaches 60° C. or more, for example, the work temperature of the stripping adhesive layer 4 is greater than 60° C. The work temperatures of the stripping adhesive layer 4 of different materials are different. For the stripping adhesive layer 4 with specific selected work temperature, the person skilled in the art may determine according to the properties of the selected sealing adhesive layer 3, so that the stability of the bonding between the stripping adhesive layer 4 and the sealing adhesive layer 3 is not affected in heating the sealing adhesive layer 3, and the embodiments of the present disclosure are not limited to this. For example, if the material of the sealing adhesive layer 3 is a thermosetting material, the work temperature of the stripping adhesive layer 4 is also higher than the curing temperature of the sealing adhesive layer 3.

For example, in the sealing structure 10, the stripping adhesive layer 4 covers an entirety of the sealing adhesive layer 3, and a portion of the stripping adhesive layer 4 overlaps the sealing adhesive layer 3. That is, the other portion of the stripping adhesive layer 4 does not overlap the sealing adhesive layer 3, and an area of a second surface which is included by the stripping adhesive layer 4 and is close to the sealing adhesive layer 3 is, for example, larger than an area of a surface which is included by the sealing adhesive layer 3 and is close to the stripping adhesive layer 4. In this way, even if the sealing adhesive layer 3 is heated and pressed during the sealing process and is heated to be likely to deform during operation process of the functional device 2 or even if the sealing adhesive layer 3 spreads toward an edge region of the base substrate 1 in FIG. 3, the sealing adhesive layer 3 is prevented from spreading beyond an edge of the stripping adhesive layer 4. Of course, this is only one embodiment of the present disclosure. In other embodiments, for example, an entirety of the stripping adhesive layer 4 overlaps the sealing adhesive layer 3, i.e., the area of the second surface which is included by the stripping adhesive layer 4 and is close to the sealing adhesive layer 3 is equal to the area of the surface which is included by the sealing adhesive layer 3 and is close to the stripping adhesive layer 4. The embodiments of the present disclosure are not limited thereto.

It should be noted that when the sealing layer 5 needs to be stripped off, the sealing adhesive layer 3 softens in the process of heating the sealing structure to weaken the stickiness of the stripping adhesive layer 4. Because the stickiness of the stripping adhesive layer 4 is weakened to enable the sealing layer 5 to be easily stripped off from the stripping adhesive layer 4, and because the stripping adhesive layer 4 is located between the sealing adhesive layer 3 and the sealing layer 5 and the stripping adhesive layer 4 covers the sealing adhesive layer 3, the softened sealing adhesive layer 3 does not contact the sealing layer 5, and thus the softening of the sealing adhesive layer 3 does not adversely affect the stripping off of the sealing layer 5.

For example, a material of the stripping adhesive layer 4 is a resin adhesive or a rubber adhesive, which is added with thermal expansion microspheres (for example, Matsumoto Yushi Seiyaku Co., Ltd: MICROSPHERE F30DS product). For example, the stripping adhesive layer 4 is formed by mixing the thermally expansion microspheres into the resin adhesive or the rubber adhesive. For example, the adhesive is an adhesive based on a rubber-based material or a resin-based material that allows the thermal expansion microspheres to foam and/or expand during heating the adhesive. For example, the adhesive is an adhesive taking one or more polymers such as natural rubber, polyester, synthetic rubber, acrylic (e.g., alkyl acrylate having carbon atoms with the number of less than 20), alkyl vinyl ether, silicone, polyamide, polyurethane and the like as a base polymer. For example, a mass content of the above alkyl acrylate having carbon atoms with the number of less than 20 in the base polymer of the adhesive is higher than 50%. For example, various additives such as a tackifying resin (e.g., a rosin-based resin, a styrene-based resin or the like), a crosslinking agent, a filler, an antioxidant and the like are added to the above-mentioned adhesive which is added with the thermal expansion microspheres and is a material forming the stripping adhesive layer 4, as required. For example, the material of the stripping adhesive layer 4 is an adhesive prepared by adding the expansion microspheres and the crosslinking agent to a synthetic polyacrylate adhesive and then curing the adhesive; the adhesive has good stickiness at the temperature lower than its work temperature of 120° C.; and after baking for 5 minutes at the temperature higher than its work temperature of 120° C., the stickiness of the adhesive is weakened to be stripped off without residue. The stripping adhesive layer 4 is, for example, the sheet-like adhesive layer having the stickiness at both the first surface close to the sealing layer 5 and the second surface facing away from the sealing layer 5. The stripping adhesive layer 4 may have different degrees of stickiness, and those skilled in the art may select according to needs. The materials listed above are merely exemplary examples, and the embodiments of the present disclosure do not limit the material of the stripping adhesive layer 4. Those skilled in the art may prepare the stripping adhesive layer 4 according to actual needs.

For example, the stripping adhesive layer 4 covers an entirety of a first surface which is included by the sealing layer 5 and faces the functional device 2. In this way, it is possible to ensure that the first surface of the sealing layer 5 contacts the stripping adhesive layer 4 and is not contaminated with other substances such as the sealing adhesive layer 3, so that the sealing layer 5 is recycled without the residual of the sealing adhesive layer and without damage to the sealing layer in the process of recycling the sealing layer 5, so as to improve the recycling quality and not affect the reuse of the recycled sealing layer.

For example, the sealing layer is a transparent film or an opaque film. For example, the sealing layer 5 is a metal film. A material of the metal thin film is, for example, gold, silver, aluminum, copper, zinc, chromium, or the like, but is not limited to the listed types. Of course, the sealing layer 5 is, for example, a sealing film other than the metal film, such as other inorganic or organic sealing films. The manufacturing cost or purchase cost of the metal film currently used for the film sealing of the functional device is relatively high; if the recycling of the metal film is realized at a price significantly lower than the manufacturing cost or purchase cost of the metal film, the production cost of the sealing structure and the production cost of the electronic device (such as a display device) applying the sealing structure are reduced to a greater extent.

It should be noted that in the situation where the sealing layer 5 is the opaque film, a light-emitting side of the functional device 2 is, for example, a side of the functional device 2 close to the base substrate 1, and light is emitted out through the base substrate 1. For example, the functional device 2 is the organic light-emitting diode (OLED) device, which, for example, has a structure of top emission or a structure of bottom emission, etc. For example, the OLED device includes a transparent anode disposed on the base substrate 1, an organic light-emitting layer disposed on the anode, and a cathode disposed on the organic light-emitting layer; for example, the cathode is a reflective electrode or a reflective layer is disposed to be adjacent to the cathode, so that the light-emitting side of the functional device 2 is the side of the functional device 2 close to the base substrate 1 shown in FIG. 3. Alternatively, the OLED device includes the cathode disposed on the base substrate 1, the organic light-emitting layer disposed on the cathode, and the anode disposed on the organic light-emitting layer, for example, the anode is the reflective electrode or the reflective layer is disposed to be adjacent to the anode, so that the light-emitting side of the functional device 2 is still the side of the functional device 2 close to the base substrate 1.

It should be noted that FIG. 3 exemplifies the sectional structure of the sealing structure 10 by taking a sectional view of one functional device (e.g., light-emitting unit) of the sealing structure 10 as an example. The sealing structure 10, for example, includes many such functional devices. The following description takes the functional device as the light-emitting unit as an example. For example, as shown in FIG. 2, the sealing structure 10 includes a plurality of pixel units 14, and each pixel unit 14, for example, include a plurality of light-emitting units 101 arranged in an array (only one light-emitting unit is exemplified in FIG. 2). For example, each of the sealing adhesive layer 3, the stripping adhesive layer 4 and the sealing layer 5 mentioned above, in a one-piece manner, covers a plane region shown in FIG. 2.

For example, in another embodiment of the present disclosure, the sealing structure 10 further includes a heat dissipation structure disposed on a side of the functional device 2 facing the sealing layer 5 or a side of the functional device 2 facing away from the sealing layer 5, and the heat dissipation structure is configured to assist the sealing structure 10 to dissipate heat. Illustratively, as shown in FIG. 4, the heat dissipation structure 6 is, for example, a heat dissipating layer is disposed between the functional device 2 and the sealing adhesive layer 3. The heat dissipation structure 6 covers the functional device 2. For example, the heat dissipation structure 6 includes a heat dissipation material, which is, for example, a heat conductive lipid, or is, for example, heat dissipating particles formed of zinc oxide, aluminum oxide or boron nitride, etc., to facilitate heat dissipation during heating in the manufacturing process of the sealing structure and during the operation of the functional device, so as to prevent excessive temperature from weakening the stickiness of the stripping adhesive layer 4 and affecting the bonding effect required. Of course, the specific position of the heat dissipation structure 6 is not limited to that shown in FIG. 4, and the heat dissipation structure 6 may be any other structure that is able to assist the heat dissipation of the sealing structure 10. Other structures of the sealing structure shown in FIG. 4 are the same as those shown in FIG. 3, and have the same or similar technical effects as the embodiment shown in FIG. 3. For other structures and technical effects of the sealing structure shown in FIG. 4, please refer to the above description and repeated description is omitted herein.

At least one embodiment of the present disclosure provides an electronic device that includes any one of the sealing structures provided by the embodiments of the present disclosure.

Figure 5:
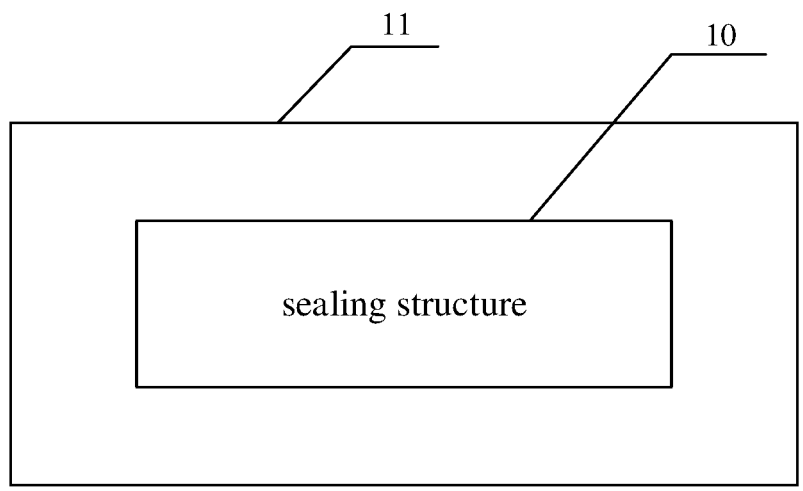
FIG. 5 is a schematic view of an electronic device according to at least one embodiment of the present disclosure.

FIG. 5 is a schematic view of the electronic device according to at least one embodiment of the present disclosure. As shown in FIG. 5, the electronic device 11 includes the sealing structure 10, for example, the sealing structure 10 includes the above-mentioned functional device. The electronic device 11 is, for example, a display device, a lighting device, a backlight device, a solar energy device, or the like. The display device is, for example, an organic light-emitting diode display device, and the backlight device is, for example, a backlight device for a liquid crystal display panel or an electronic paper display panel. For example, the display device is implemented as any product or component with a display function such as a mobile phone, a tablet computer, a television, a display, a notebook computer, a navigator, etc.

The electronic device 11 further includes, for example, a driver circuit configured to control a work state of the functional device. For example, the driver circuit is disposed on the base substrate of the sealing structure and configured to control the work state of the functional device. For example, the functional device is a light-emitter device, the driver circuit controls whether the functional device emits light or not and controls an intensity of emitted light, etc. For example, as shown in FIG. 2, the driver circuit is a pixel driver circuit, which includes, for example, gate lines 9 and data lines 12 which are disposed in a non-display region 13.

The embodiments of the present disclosure do not specifically limit other structures of the electronic device. According to the type of the electronic device and the function to be realized by the electronic device, those skilled in the art may design the electronic device according to actual needs.

At least one embodiment of the present disclosure provides a sealing method, which includes: providing the base substrate on which the functional device is provided; forming the sealing layer covering the functional device; and forming the stripping adhesive layer, which is bonded between the sealing layer and the functional device and has the changeable stickiness to assist the stripping off of the sealing layer.

Figure 6A:
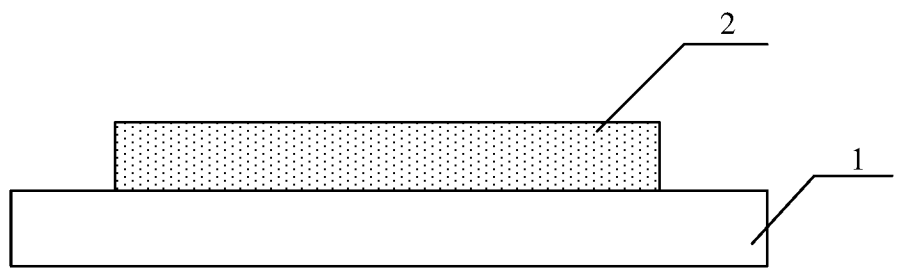
FIGS. 6A-6E are schematic views of a sealing method provided by at least one embodiment of the present disclosure.
Figure 6B:
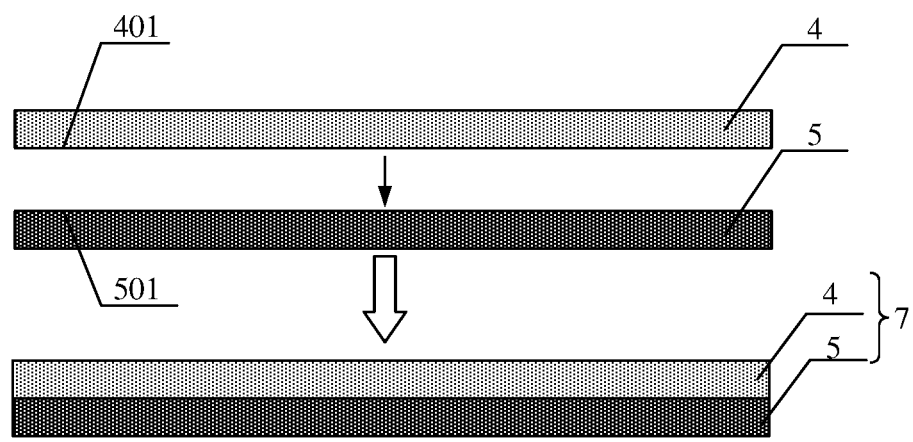
Figure 6C:
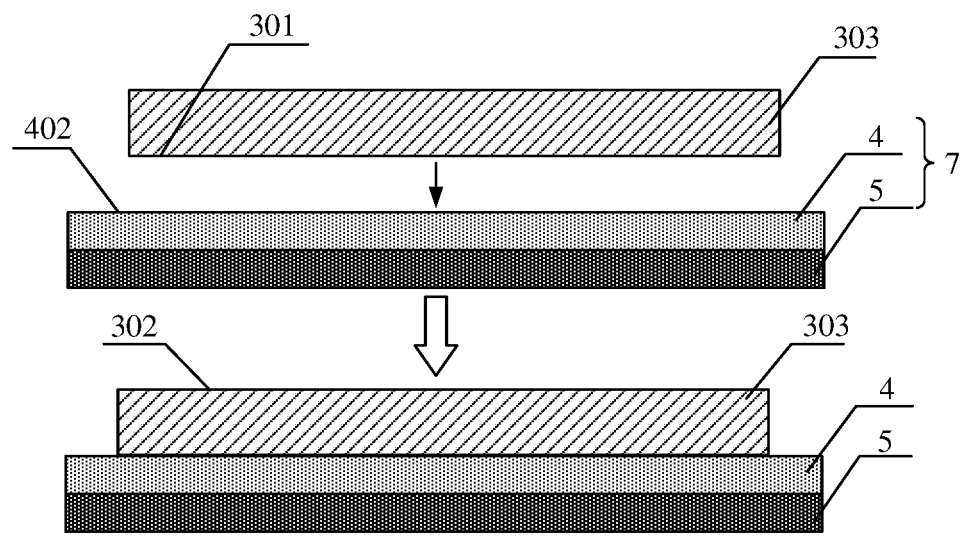
Figure 6D:
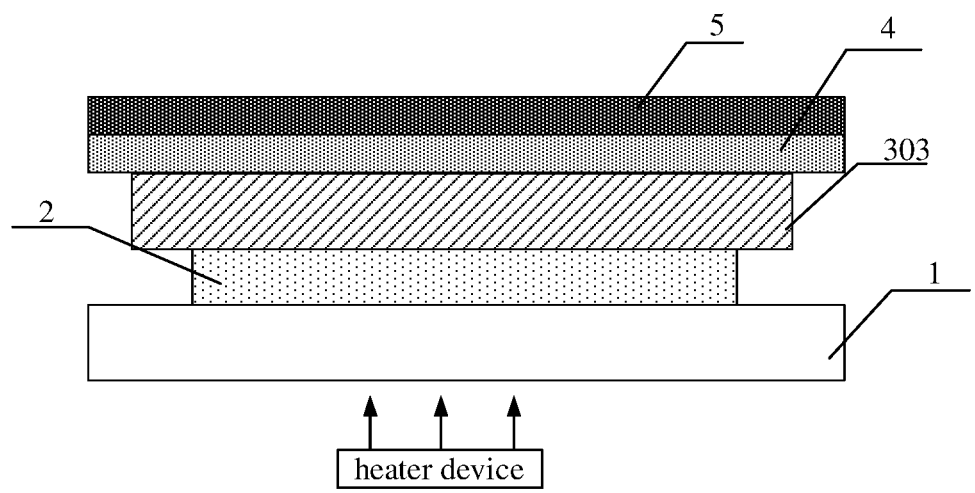
Figure 6E:
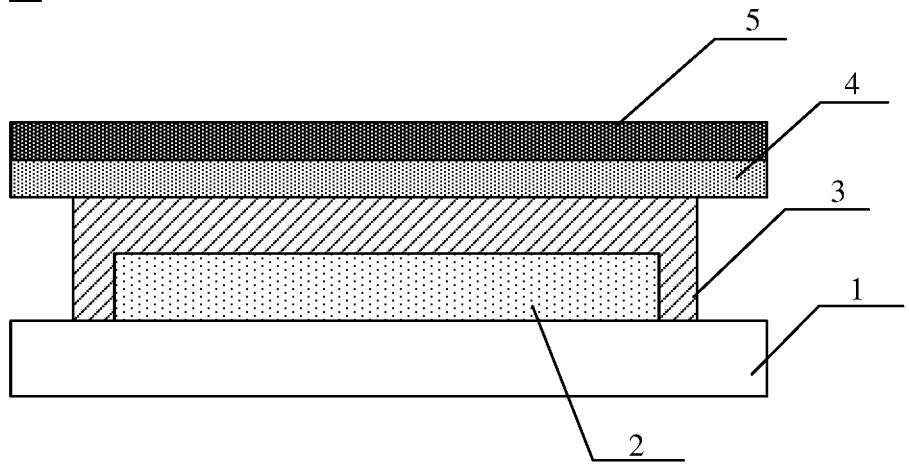
Figure 7A:
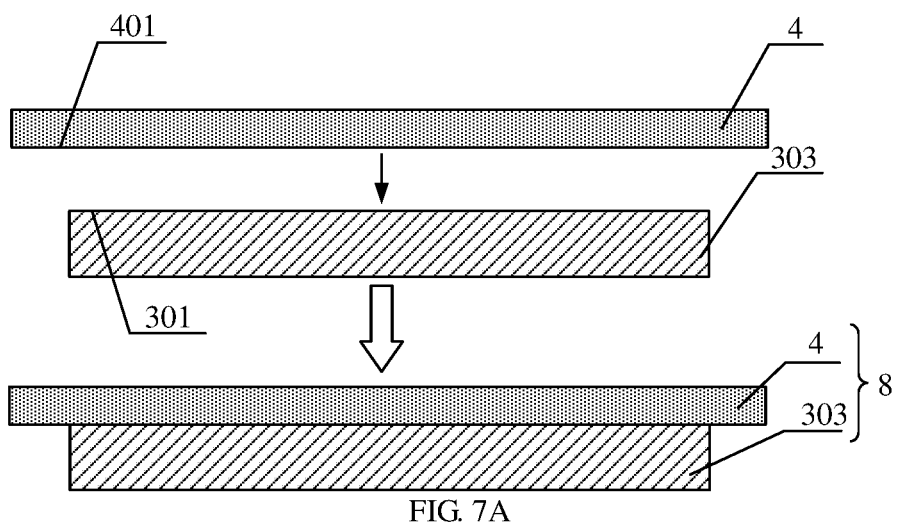
FIGS. 7A-7B are another schematic views of the sealing method provided by at least one embodiment of the disclosure.
Figure 7B:
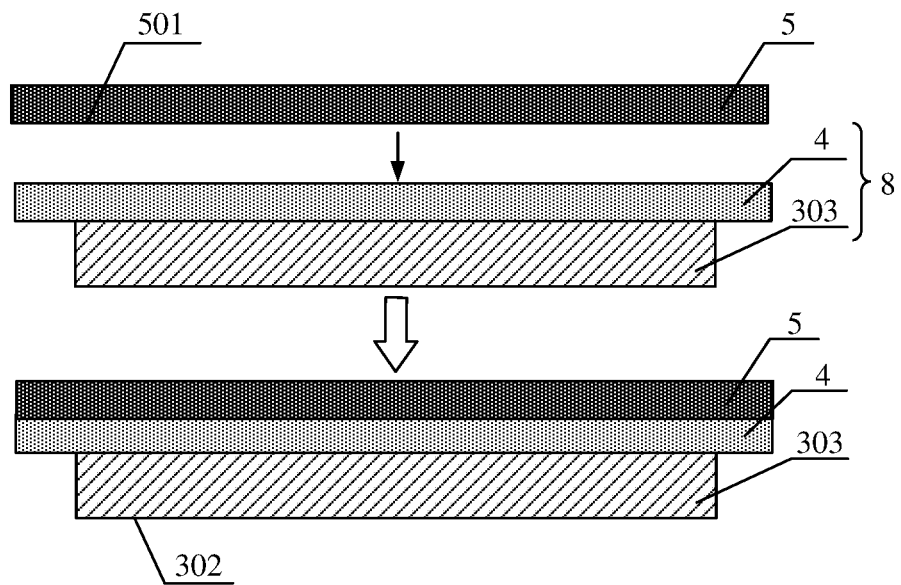
Figure 8A:
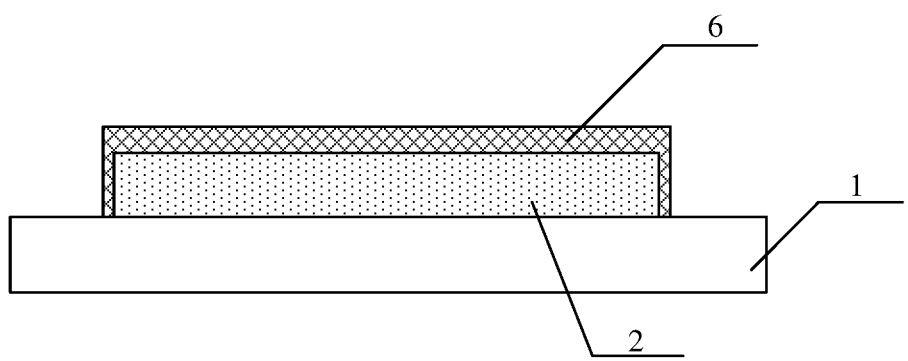
FIGS. 8A-8C are still another schematic views of the sealing method provided by at least one embodiment of the disclosure.
Figure 8B:
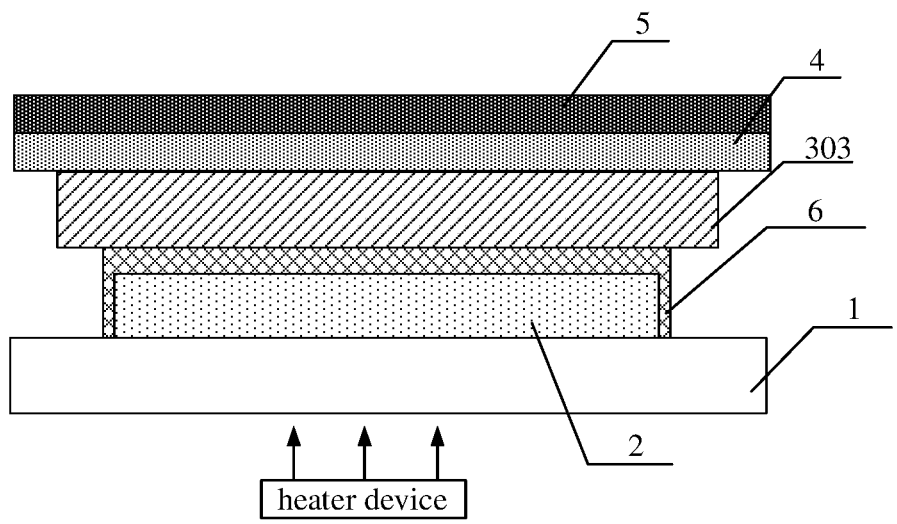
Figure 8C:
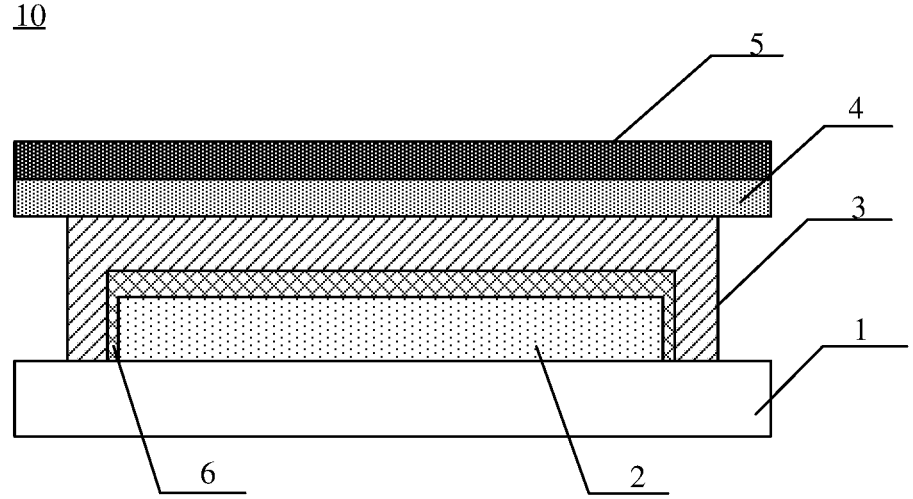

FIGS. 6A-6E are schematic views of the sealing method provided in at least one embodiment of the disclosure, FIGS. 7A-7B are another schematic views of the sealing method provided in at least one embodiment of the disclosure, and FIGS. 8A-8C are still another schematic views of the sealing method provided in at least one embodiment of the disclosure.

Illustratively, as shown in FIG. 6A, the base substrate 1 is provided, and the functional device 2 is provided on the base substrate 1. The functional device 2 is, for example, the organic light-emitting diode (OLED) device; for example, the transparent anode, the organic light-emitting layer and the cathode are sequentially formed on the base substrate 1, and the cathode is, for example, the reflective electrode or the reflective layer is, for example, provided on the base substrate 1 and is adjacent to the cathode, so that the light-emitting side of the functional device 2 is the side of the functional device 2 close to the base substrate 1 as shown in FIG. 6B. Alternatively, the functional device 2 is, for example, the electroluminescent (EL) device or the like. Those skilled in the art may form the functional device 2 according to actual needs.

For example, in at least one embodiment of the present disclosure, as shown in FIG. 6B, for example, the first surface 401 of the stripping adhesive layer 4 is attached to the first surface 501 of the sealing layer 5 to form a structure 7 of the sealing layer 5 and the stripping adhesive layer 4. The stripping adhesive layer 4 has the changeable stickiness to assist the stripping off of the sealing layer 5 if necessary. For example, the stripping adhesive layer 4 has the work temperature, and in the situation where the stripping adhesive layer 4 is heated to the work temperature or above the work temperature, the stickiness of the stripping adhesive layer 4 is weakened and the sealing layer 5 becomes easy to be stripped off from the stripping adhesive layer 4. The material of the stripping adhesive layer 4 is referred to the description in the previous embodiments and is not described again here.

For example, the sealing method further includes forming the sealing adhesive layer 3 by using the sealing adhesive 303, and the sealing adhesive layer 3 is located between the functional device 2 and the stripping adhesive layer 4 and bonds the stripping adhesive layer 4 with the functional device 2. As shown in FIG. 6C, the first surface 301 of the sealing adhesive 303 is attached to the second surface 402 of the stripping adhesive layer 4, and the second surface 402 of the stripping adhesive layer 4 is opposite to the first surface 401 of the stripping adhesive layer 4, so that the sealing adhesive 303 is bonded together with the structure 7 of the sealing layer 5 and the stripping adhesive layer 4. As shown in FIG. 6D, the second surface 302 of the sealing adhesive 303 is bonded to the functional device 2, and the second surface 302 of the sealing adhesive 303 is opposite to the first surface 301 of the sealing adhesive 303, so that the sealing layer 5 covers the functional device 2 and the stripping adhesive layer 4 is bonded between the sealing layer 5 and the functional device 2. In this case, the sealing adhesive 303 is located on the upper side of the functional device 2 shown in FIG. 6D. The sealing method, for example, further includes heating the sealing adhesive 303 until the sealing adhesive 303 becomes soft. For example, the sealing adhesive 303 is heated to 60° C. or above. The specific heating temperature may be determined according to the material properties of the sealing adhesive 303. Then, the sealing adhesive 303 is pressed to form the sealing adhesive layer 3 as shown in FIG. 6E, so that the sealing adhesive layer 3 seals the functional device 2. Then, the sealing adhesive layer 3 is cured, the sealing structure 10 shown in FIG. 6E is formed, for example. For example, the sealing adhesive layer 3 is a thermosetting adhesive, and the curing of the sealing adhesive layer 3 is realized, for example, during the above-mentioned process of heating and pressing. In a situation where the sealing adhesive layer 3 is an ultraviolet curing type adhesive, the sealing adhesive layer 3 is cured by ultraviolet irradiation after the pressing, for example. Those skilled in the art may select a specific curing method according to the properties of the material of the sealing adhesive layer 3. The material of the sealing adhesive layer 3 and the material of the sealing layer 5 are also described in previous embodiments, and are not described again here.

For example, the above-mentioned heating includes radiation heating, convection heating or heat conduction heating, for example, infrared heating or heating furnace or the like is used to perform the heating.

It should be noted that the temperature at which the sealing adhesive 303 is heated to be soften and the curing temperature of the sealing adhesive layer 3 are lower than the work temperature of the stripping adhesive layer 4, so as to prevent the weakening of the stickiness of the stripping adhesive layer 4, which is caused by the heating during the sealing process and which affects the stability of the bonding between the stripping adhesive layer 4 and each of the sealing layer 5 and the sealing adhesive layer 3.

For example, in at least one embodiment of the present disclosure, as shown in FIG. 7A, the first surface 401 of the stripping adhesive layer 4 is attached to the first surface 301 of the sealing adhesive 303, to form a structure 8 of the stripping adhesive layer 4 and the sealing adhesive 303.

As shown in FIG. 7B, the sealing layer 5 is bonded to the second surface 402 of the stripping adhesive layer 4, and the second surface 402 of the stripping adhesive layer 4 is opposite to the first surface 401 of the stripping adhesive layer, so that the sealing layer 5 is bonded together with the structure 8 of the stripping adhesive layer 4 and the sealing adhesive 303.

The second surface 302 of the sealing adhesive 303 is bonded to the functional device 2, and the second surface 302 of the sealing adhesive 303 is opposite to the first surface 301 of the sealing adhesive 303. Thus, the structure shown in FIG. 6D is formed, for example. The subsequent steps of heating, pressing and curing the sealing adhesive 303 are the same as those described in the previous embodiments, please refer to the previous description. The sealing structure 10 shown in FIG. 6E is formed by this method, for example.

For example, in at least one embodiment of the present disclosure, the sealing method further includes forming the heat dissipation structure located on the side of the functional device 2 facing the base substrate 1 or on the side of the functional device 2 facing away from the base substrate 1 to assist the functional device 2 of the sealing structure to dissipate heat. Illustratively, as shown in FIG. 8A, for example, the heat dissipation structure 6 covering the functional device 2 is formed, and the heat dissipation structure 6 includes, for example, the heat dissipation material, which is, for example, the heat conductive lipid, or is, for example, heat dissipating particles formed of zinc oxide, aluminum oxide, boron nitride, or the like. For example, the heat dissipation structure 6 is formed by coating. The heat dissipation structure 6 is beneficial to the heat dissipation during heating in the manufacturing process of the sealing structure and during the operating process of the functional device, so as to prevent the weakening of the stickiness of the stripping adhesive layer 4, which is caused by too a high temperature and which affects the bonding effect required in the normal state.

After the heat dissipation structure 6 is formed, for example, a structure in which the sealing adhesive layer 5, the stripping adhesive layer 4 and the sealing adhesive 303 are bonded together is formed by using the same method as that in the previous embodiments. As shown in FIG. 8B, the second surface 302 which is included by the sealing adhesive 303 and is opposite to the first surface 301 of the sealing adhesive 303 is bonded to the heat dissipation structure 6, so that the sealing layer 5 covers the heat dissipation structure 6 and the functional device 2, and the stripping adhesive layer 4 is bonded between the sealing layer 5 and the functional device 2. The subsequent steps of heating, pressing and curing the sealing adhesive 303 are the same as those in the previous embodiments, please refer to the previous description. The sealing structure 10 shown in FIG. 8C is formed by this method, for example.

At least one embodiment of the present disclosure provides a sealing layer recycling method, which is applicable to any sealing structure provided by the embodiments of the present disclosure. The method includes: treating the sealing structure until the stickiness of the stripping adhesive layer is weakened; and separating the sealing layer from the stripping adhesive layer.

Figure 9A:
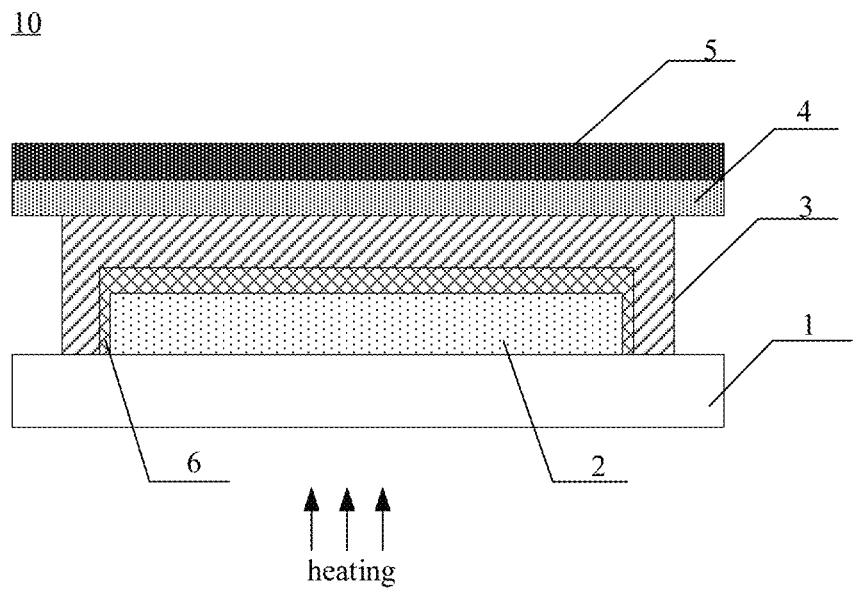
FIGS. 9A-9B are schematic views of a sealing layer recycling method according to at least one embodiment of the present disclosure.
Figure 9B:
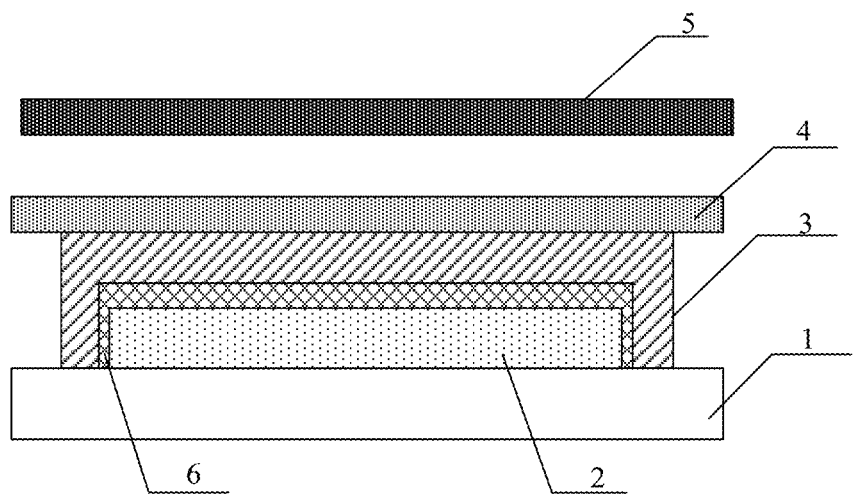

For example, FIGS. 9A-9B are schematic views of the sealing layer recycling method according to at least one embodiment of the present disclosure. As shown in FIG. 9A, the above-mentioned treating includes: heating the sealing structure 10. For example, the stripping adhesive layer has the work temperature, and in the situation where the stripping adhesive layer is heated to the work temperature or above the work temperature, the stickiness of the stripping adhesive layer is weakened and the sealing layer 5 becomes easy to be stripped off from the stripping adhesive layer 4. The degree to which the stickiness of the stripping adhesive layer is weakened is as follows: in the situation where the stripping adhesive layer is heated to the work temperature or above the work temperature, the stickiness of the stripping adhesive layer is weakened to such an extent that the stripping adhesive layer and the sealing layer are separated without leaving the residual of the stripping adhesive layer on the first surface which is included by the sealing layer and is in contact with the stripping adhesive layer.

For example, if the work temperature of the stripping adhesive layer is 90° C., the stripping adhesive layer 4 is heated to the temperature of 90° C. or higher for, for example, 3 to 5 minutes, and the stickiness of the stripping adhesive layer is weakened to be easily stripped off. Then, as shown in FIG. 9B, the sealing layer 5 (e.g., a metal sealing layer) is separated from the stripping adhesive layer 4, for example, the sealing layer 5 is removed from the stripping adhesive layer 4 without leaving the residual of the stripping adhesive layer 4 on the surface of the sealing layer 5 and without leaving the residual of the sealing layer 5 on the surface of the stripping adhesive layer 4, for example, the sealing layer 5 is stripped off. In this way, for example, in recycling the sealing layer of the sealing structure, the sealing layer is recycled without the residual and the damage to the sealing layer and thus the sealing layer is reused for sealing another functional device, and then the obtained sealing structure is applied to the electronic device. Moreover, for example, this recycling process is realized at the cost lower than the manufacturing or purchase price of the sealing layer. This is beneficial to the recycling of resources and the decrease of the production cost of the sealing structure and the electronic device.

For example, the above heating includes radiation heating, convection heating or heat conduction heating. For example, the infrared heating or the heating furnace is used to heat the sealing structure. For example, the infrared heating is used, to realize directional and non-contact heating, which is more beneficial to the recycling operation.

What are described above is related to the illustrative embodiments of the disclosure only and not limitative to the scope of the disclosure; the scopes of the disclosure are defined by the accompanying claims.

What is claimed is:

1. A sealing structure for sealing a functional device, comprising:
a sealing layer, covering the functional device;
a stripping adhesive layer, bonded between the sealing layer and the functional device, and having a changeable stickiness to assist stripping off of the sealing layer; and
a sealing adhesive layer, provided between the functional device and the stripping adhesive layer and bonding the stripping adhesive layer and the functional device,
wherein the stripping adhesive layer is provided between the sealing layer and the sealing adhesive layer and directly contacts each of the sealing layer and the sealing adhesive layer, and an adhesive strength between the stripping adhesive layer and the sealing adhesive layer is higher than an adhesive strength between the stripping adhesive layer and the sealing layer, so that the stripping adhesive layer is not separated from the sealing adhesive layer and the stripping adhesive layer and the sealing adhesive layer remain covering the functional device when the sealing layer is stripped off,
wherein the stripping adhesive layer has a work temperature, the changeable stickiness of the stripping adhesive layer is weakened in a situation where the stripping adhesive layer is heated to the work temperature or above the work temperature, and the work temperature is higher than a temperature of softening the sealing adhesive layer, and
wherein the temperature of softening the sealing adhesive layer is a temperature at which the sealing adhesive layer becomes soft, and the work temperature of the stripping adhesive layer is a temperature at which the changeable stickiness of the stripping adhesive layer is weakened.

2. The sealing structure according to claim 1, wherein the stripping adhesive layer covers an entirety of the sealing adhesive layer.

3. The sealing structure according to claim 1, wherein the stripping adhesive layer covers an entirety of a first surface which is comprised by the sealing layer and which faces the functional device.

4. The sealing structure according to claim 1, wherein the sealing layer is a metal film.

5. The sealing structure according to claim 1, wherein a material of the stripping adhesive layer is a resin adhesive added with thermal expansion microspheres, or a rubber adhesive added with the thermal expansion microspheres.

6. The sealing structure according to claim 1, further comprising a heat dissipation structure on a side of the functional device facing the sealing layer or on a side of the functional device facing away from the sealing layer, wherein the heat dissipation structure is configured to assist heat dissipation of the sealing structure.

7. An electronic device, comprising the functional device and the sealing structure according to claim 1.

8. The electronic device according to claim 7, further comprising a driver circuit, wherein the driver circuit is configured to control a work state of the functional device.

9. A sealing layer recycling method applicable to the sealing structure according to claim 1, comprising:
treating the sealing structure until the changeable stickiness of the stripping adhesive layer is weakened, and separating the sealing layer from the stripping adhesive layer, wherein the stripping adhesive layer is not separated from the sealing adhesive layer and the stripping adhesive layer and the sealing adhesive layer remain covering the functional device.

10. The sealing layer recycling method according to claim 9, wherein the treating comprises heating the sealing structure.

11. The sealing layer recycling method according to claim 10, wherein the heating comprises radiation heating, convection heating or heat conduction heating.

12. The sealing structure according to claim 1, wherein one portion of the stripping adhesive layer overlaps the sealing adhesive layer, and the other portion of the stripping adhesive layer does not overlap the sealing adhesive layer.

13. A sealing method, comprising:
providing a base substrate on which a functional device is provided;
forming a sealing layer covering the functional device;
forming a stripping adhesive layer, wherein the stripping adhesive layer is bonded between the sealing layer and the functional device, and the stripping adhesive layer has a changeable stickiness to assist stripping off of the sealing layer; and
forming a sealing adhesive layer by using a sealing adhesive, wherein the sealing adhesive layer is between the functional device and the stripping adhesive layer and bonds the stripping adhesive layer and the functional device,
wherein the stripping adhesive layer is provided between the sealing layer and the sealing adhesive layer and directly contacts each of the sealing layer and the sealing adhesive layer, and an adhesive strength between the stripping adhesive layer and the sealing adhesive layer is higher than an adhesive strength between the stripping adhesive layer and the sealing layer, so that the stripping adhesive layer is not separated from the sealing adhesive layer and the stripping adhesive layer and the sealing adhesive layer remain covering the functional device when the sealing layer is stripped off,
wherein the stripping adhesive layer has a work temperature, the changeable stickiness of the stripping adhesive layer is weakened in a situation where the stripping adhesive layer is heated to the work temperature or above the work temperature, and the work temperature is higher than a temperature of softening the sealing adhesive layer, and
wherein the temperature of softening the sealing adhesive layer is a temperature at which the sealing adhesive layer becomes soft, and the work temperature of the stripping adhesive layer is a temperature at which the changeable stickiness of the stripping adhesive layer is weakened.

14. The sealing method according to claim 13, wherein
a structure of the sealing layer and the stripping adhesive layer is formed by attaching a first surface of the stripping adhesive layer to a first surface of the sealing layer;
a first surface of the sealing adhesive is attached to a second surface of the stripping adhesive layer, wherein the second surface of the stripping adhesive layer is opposite to the first surface of the stripping adhesive layer; and
a second surface of the sealing adhesive is bonded to the functional device, wherein the second surface of the sealing adhesive is opposite to the first surface of the sealing adhesive.

15. The sealing method according to claim 13, further comprising:
heating the sealing adhesive;
forming the sealing adhesive layer by pressing the sealing adhesive so that the sealing adhesive layer seals the functional device; and
curing the sealing adhesive layer,
wherein a temperature for heating the sealing adhesive is lower than the work temperature of the stripping adhesive layer.

16. The sealing method according to claim 13, wherein
a structure of the stripping adhesive layer and the sealing adhesive is formed by attaching a first surface of the stripping adhesive layer to a first surface of the sealing adhesive;
the sealing layer is bonded to a second surface of the stripping adhesive layer, wherein the second surface of the stripping adhesive layer is opposite to the first surface of the stripping adhesive layer; and
a second surface of the sealing adhesive is bonded to the functional device, wherein the second surface of the sealing adhesive is opposite to the first surface of the sealing adhesive.

17. A sealing structure for sealing a functional device, comprising:
a sealing layer, covering the functional device;
a stripping adhesive layer, bonded between the sealing layer and the functional device, and having a changeable stickiness to assist stripping off of the sealing layer; and
a sealing adhesive layer, provided between the functional device and the stripping adhesive layer and bonding the stripping adhesive layer and the functional device,
wherein the stripping adhesive layer is provided between the sealing layer and the sealing adhesive layer and directly contacts each of the sealing layer and the sealing adhesive layer, and an adhesive strength between the stripping adhesive layer and the sealing adhesive layer is higher than an adhesive strength between the stripping adhesive layer and the sealing layer, so that the stripping adhesive layer is not separated from the sealing adhesive layer and the stripping adhesive layer and the sealing adhesive layer remain covering the functional device when the sealing layer is stripped off,
wherein the sealing adhesive layer comprises a filling material doped into a base material,
wherein the filling material comprises a hygroscopic material, a heat dissipation material, or an oxygen absorption material, and
wherein the base material comprises a thermosetting sealant or a photocurable sealant.

* * * * *